United States Patent [19]

Van Voorhis

[11] 4,190,900
[45] Feb. 26, 1980

[54] MAJOR/MINOR LOOP BUBBLE MEMORY WITH TIMING LOOP

[75] Inventor: David C. Van Voorhis, Campbell, Calif.

[73] Assignee: International Business Machines Corporation, Armonk, N.Y.

[21] Appl. No.: 890,157

[22] Filed: Mar. 27, 1978

[51] Int. Cl.² ............................................. G11C 19/08
[52] U.S. Cl. ........................................ 365/15; 365/12
[58] Field of Search .................................. 365/15, 16

[56] References Cited
U.S. PATENT DOCUMENTS 4,027,283  5/1977  Tang ...................................... 365/15

4,159,412  6/1979  Naden et al. ......................... 365/15

Primary Examiner—James W. Moffitt
Attorney, Agent, or Firm—Joseph E. Kieninger

[57] ABSTRACT

A major/minor loop bubble memory configuration that provides gap free serial access to the data in the minor loops and which maintains the non-volatility of data when subjected to a power-on-off-on sequence. The configuration includes a timing minor loop in combination with the data storage minor loops in the major/minor loop array. The placement of a single timing bubble within the timing loop permits gap free serial access to the data in the remaining storage minor loops.

6 Claims, 7 Drawing Figures

MAJOR/MINOR LOOP BUBBLE MEMORY WITH TIMING LOOP

DESCRIPTION

1. Technical Field

This invention relates to a major/minor loop bubble configuration, and more particularly to a memory system that maintains the non-volatility of data when subjected to a power on-off-on sequence and which provides gap free serial access to the data.

It is a primary object of this invention to provide an improved bubble memory system.

It is a another object of this invention to provide an improved major/minor loop bubble memory system.

It is still another object of this invention to provide a gap free serial access major/minor loop bubble memory system.

It is yet still another object of this invention to provide an improved non-volatile major/minor loop bubble memory system.

It is a further object of this invention to provide a major/minor loop bubble system which maintains the rotational position of the minor loops.

It is yet another object of this invention to provide a major/minor loop bubble system which maintains the non-volatility of data when subjected to a power on-off-on sequence and which provides gap free serial access to the data.

2. Description of the Prior Art

Several different major/minor loop memory organizations are described in U.S. Pat. Nos. 3,618,054; 3,838,407 and 3,999,172. Typically, both the major loop and the minor loop are established by an arrangement of TI-bar or C-bar permalloy type circuits on a film of a magnetic garnet material. The bubble domains or bubbles are moved around the loop by a magnetic field which rotates in the plane of the magnetic material. The major loop is generally elongated such as to allow a number of minor loops to be aligned along the side. The major loop may be closed as shown in U.S. Pat. No. 3,618,054. With a closed major loop, two-way transfer gates permit the transfer of bubbles from the minor loops to the major loop and from the major loop to the minor loops. Major loops may also be of the open type disclosed in U.S. Pat. Nos. 3,838,407 and 3,999,172. With the open type of major type, one-way transfer gates from the write channel of the major loop transfer bubbles into one side of the minor loops and another transfer gate permits bubbles to be transferred out of the other end of the minor loops into the read channel of the major loop. Data information stored in the minor loop is circulated until the desired block of data consisting of one bit from each loop reaches the transfer points. On command of a read transfer signal, the information is transferred to the read channel of the major loop whereupon it is read by a detector. The detected information, or alternatively new information, is used to control the generation of bubbles which are subsequently propagated along the write channel of the major loop to the write transfer switches. On command of a write transfer signal, the information is transferred from the write channel into the minor loops.

The relative path lengths of the major and minor loops are adjusted so that the vacancy created in each minor loop when a block of data is switched out of the minor loops will subsequently be in a position to receive the corresponding bit of data when the block is switched back into the minor loops. In this manner, data in the minor loops can be routed to the detector in order to be read and then restored back into the minor loops again. Each read transfer operation is followed by a write transfer operation which occurs a fixed number of inplane field cycles later. The number of cycles is equal to the propagation path distance along the major loop from the read transfer switch of any minor loop to the corresponding write transfer switch of the same minor loop. This characteristic is common to the various types of major/minor loop organization.

The non-volatility, i.e., the fact that bubbles are not lost when power is turned off, is one of the primary advantages bubble domains have over competing memory technologies such as charge-coupled devices. In a major/minor loop bubble memory no data is lost when the power is turned off. However, even though the data in the memory is not lost when power is turned off, the relative positions of the data in the memory may be lost.

The relative position of the data in the memory involves two aspects. First, the identity and location in the major loop of one or more blocks of data. Second, the rotational position of the minor loops, that is, where a particular block of data is located in the minor loops. If the power is turned off when data is in the major loop and in the process of being read, information may be lost as to when to strobe the write transfer switches in order to write the data back into the minor loops. In other words, the memory user may not know when a block of data in the major loop is in position to be transferred back into the minor loops. This information is sometimes referred to as the read/write state or status of the bubble memory. This information is typically maintained in a counter which, for cost effective reasons, is usually a volatile counter, that is, it is powered by a voltage source. Similarly, the rotational position of the minor loops is typically maintained in a second volatile counter. When this voltage source fails or is turned off, the information on these counters is lost.

One approach to this problem has been to require the power to be maintained until all data in the major loop can be re-entered into the minor loops and the minor loops can be rotated to a known orientation. This approach, however, is costly since it requires the use of an energy storage device in the power system such as a very large capacitor or ferroresonant circuit.

Another approach to maintaining the bubble status when a bubble memory is subjected to a power on-off-on sequence is described by Hoffman et al. in the article entitled "Designing a Magnetic Bubble Data Recorder" in Computer Design, April, 1976, pages 99–107. In this article, Hoffman et al. employ a separate non-volatile core memory which keeps track of the bubble status even after the power is turned off. The use of a core memory with a bubble memory system is expensive since it involves the use of two different types of memory technologies.

One approach for maintaining the read/write status is described in the copending patent application Ser. No. 826,492 filed 8/22/77 and assigned to the assignee of the present invention. This approach describes the use of a bubble domain shift register which is associated with a major/minor loop array to indicate when a block of data in the major loop is in position to be transferred into the minor loops. While the copending application refers to the status of data in the major loop, it does not address the problem of the rotational position of the minor loops.

Another approach for maintaining the rotational position of the minor loops is to reserve a portion of each block of data for storing the address of that block. However, since this address must be read every time the block is accessed, instead of merely when power is first applied and the rotational position of the minor loops is unknown, the reading of the address imposes a time delay between the availability of the last byte of data in one block and the first byte of the next successive block. This time delay or "gap" in the data is highly undesirable for applications requiring a continuous stream of data to a synchronous device such as a magnetic tape. This continuous stream of data requires gap-free access to successive blocks of data in the bubble memory.

DISCLOSURE OF THE INVENTION

For a further understanding of the invention, and of the object and advantages thereof, reference will be had to the following description and accompanying drawings, and to the appended claims in which the various novel features of the invention are more particularly set forth.

Accordingly, the invention comprises a major/minor loop memory configuration including a timing loop in combination with the data storage minor loops in the major/minor loop array. The placement of a timing bubble within the timing loop permits gap-free serial access to the data in the remaining data storage minor loops. When the timing bubble is transferred out of the minor loop into the major loop and subsequently detected, the relative position of all of the minor loops is thereby determined. The presence of a timing bubble in the timing loop permits the major/minor loop bubble memory to have a self-contained status means.

BEST MODE FOR CARRYING OUT THE INVENTION

We first describe the physical characteristics of the major/minor loop bubble memory system according to the invention.

Figure 1:
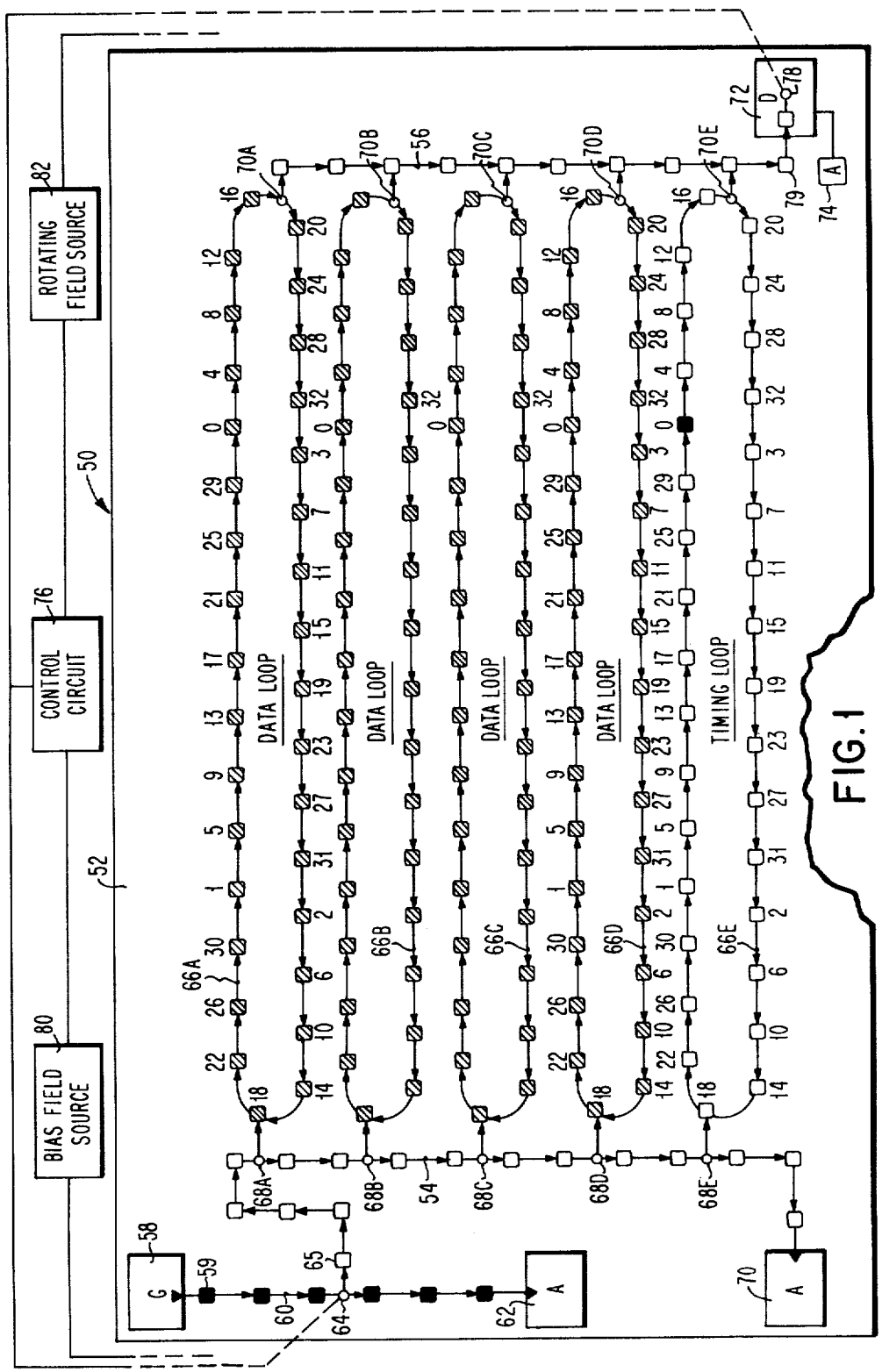
FIG. 1 is a schematic view of the major/minor loop bubble memory system in accordance with this invention.

As shown in FIG. 1, the bubble domain memory system 50 includes a film 52 of a suitable magnetic material such as a magnetic garnet material. The memory system 50 has a major loop write channel 54 and a major loop read channel 56. A bubble generator 58 generates a continuous stream of bubbles which pass along channel 60 to annihilator 62 or are transferred into write channel 54 at switch 64. Bubbles that are switched into right channel 54 are either switched into the minor loops 66a, b, c, d, e through write transfer switches 68a, b, c, d, e or into the annihilator 70. The write transfer switches 68a, b, c, d and e transfer bubbles from the major loop write channel 54 into minor loops 66a, b, c, d and e, respectively. Data information is stored in the minor loops 66a, b, c and d as is well known in the art, and minor loop 66e stores timing information as will be described. At the end of minor loops 66a, b, c, d and e, are read transfer switches 70a, b, c, d and e respectively which switch bubbles from the minor loops into the major loop read channel 56. The bubbles are propagated down the channel 56 to the bubble detector 72 which reads the information. The bubbles are then destroyed by the annihilator 74. As each data bit is read by the bubble detector 72, generator 58 and switch 64 are operated by control circuit 76 to copy the bit into position 65 of write channel 54, or to replace it with new data. The new or copy block of data is propagated to switches 68a, b, c, d and e and then transferred into the minor loops.

It is important to observe that reading of data from the major/minor loop array must occur before each write operation. This is because it is not permissible to merge an incoming bubble with a bubble already in the minor loop. Reading of the data first assures a vacancy at that location.

In accordance with this invention, a minor loop 66e is included specifically for timing purposes, and is associated with write transfer switch 68e and read transfer switch 70e. The timing loop 66e contains one bubble therein at a specific bit location. The process of transferring data into and out of the data minor loops 66a, b, c and d always maintains the integrity of the lone timing bubble in the timing loop 66e so that the rotational position of all data loops 66a, b, c and d can be determined by searching for and finding the bubble in timing loop 66e. The placement of the timing bubble within the timing loop 66e permits gap-free serial access to the data in the remaining data minor loops 66a, b, c and d.

Each of the small squares in FIG. 1 represents a permalloy site capable of retaining a bubble. In such a memory system, the following dimensions are of significance. The number of data minor loops in this example is $M=4$. The number of bits in data loops 66a, b, c, d and in timing loop 66e is $N=33$. The number of bit positions between read transfer switch 70e and the sensor element 78 is $LD=3$. The number of bit positions between data switch 64 and write transfer switch 68a at the left end of data loop 66a is $SL=5$. While the example shown in FIG. 1 is too small to represent a practical bubble chip, the dimensions do illustrate the following requirements for actual bubble chips. 2M and N are relatively prime, and hence N is odd. $2M+2$ and N are relatively prime. $LD+SL+2M=(N-1)/2$.

The normal operation of the bubble chip illustrated in FIG. 1 requires a bias field supplied by a source 80 which maintains a magnetic domain at a desired size while a rotating field source 82 is provided for generating an inplane magnetic field for synchronously advancing the bubble domains simultaneously around the loops and along the paths. The control circuit 76 performs a customary function of controlling the rotating field switches, generator, detectors, and annihilators as is well known in the art.

Each single rotation of the inplane field from the rotating field source 82 causes all bubbles to advance from one square to the next in the direction of the arrows, except that bubbles entering annihilators 62 and 70 and bubbles reaching sensor elements 78 are destroyed. Each rotation of the inplane field also causes generator 58 to supply one bubble to position 59.

During each inplane field rotation the bubble switches 64, 68a, b, c, d, e and 70a, b, c, d, and e can be operated to direct bubbles to either of two alternate bubble positions. For example, data switch 64 can be operated to direct a bubble to continue in channel 60 to annihilator 62 or to position 65 of write channel 54. As has been observed, all of the switches 68a, b, c, d, and e at the left end of the loops 66a, b, c, d and e are operated in unison so that either all or none of these switches direct data toward these loops. Similarly, the switches 70a, b, c, d and e at the right end of the loops all are operated in unison.

During each inplane rotation, the bits reaching the sensor element 78 of detector 72 are sensed and then destroyed by annihilator 74. However, the bits are sensed early enough during a 360° rotation that the presence or absence of bubbles at this sensor element can be used to determine the operation of the bubble switches during the same rotation. Thus, during any 360° rotation of the inplane field, a bubble or a space can be detected at sensor element 78 and data switch 64 can be operated to produce an identical bubble or space at position 65. Hence, a data bit can effectively be propagated from position 78 to position 65 during one 360° rotation of the inplane field.

After the bubble chip has been initialized, it contains a single bubble in the timing loop 66e and $N=33$ blocks of $M=4$ bits of data in the data loops 66a, b, c and d. The squares in the loops 66a, b, c, d and e and elsewhere in FIG. 1 are solid to indicate the presence of a bubble, empty to indicate a space or lined to indicate the presence of a data bit which may be either a bubble or a space.

The following five steps will allow gap-free serial access to up to N sequentially numbered blocks of data in the bubble chip. Assuming that the initial state of the chip is as shown in FIG. 1. The first step is to rotate the inplane field to propagate the bits around the loop until the desired block of data is just ready to enter the read switches 70a, b, c and d at the right end of the loops. For example, four inplane field rotations will position block 0 in the squares next to the switches 70a, b, c, d and e. These squares contain block 16 in FIG. 1.

Figure 2:
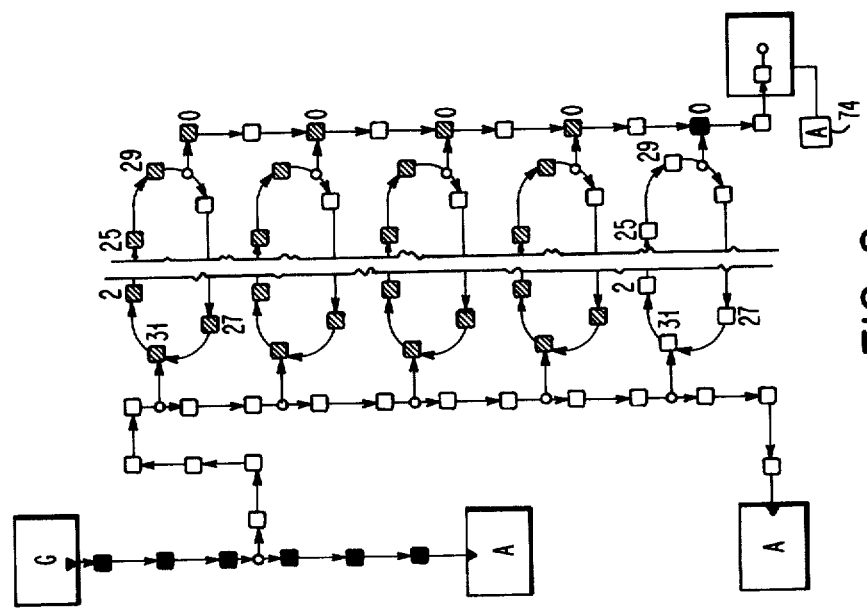

The inplane field is then rotated once and read switches 70a, b, c, d and e are operated to transfer the block of data from the bit positions numbered "0" in the data loops 66a, b, c and d and the one bit from the timing loop 66e into read channel 56 as shown in FIG. 2. This leaves vacant one spot in each data loop as well as bit position numbered "0" in timing loop 66.

Figure 3:
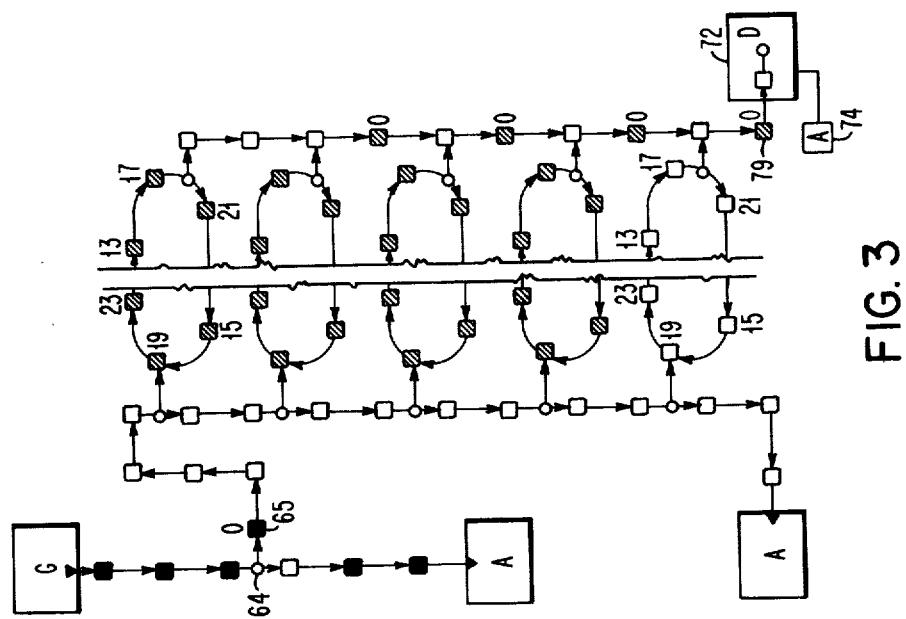
FIGS. 2-7 illustrate the gap-free serial access in accordance with this invention.

The inplane field is then rotated LD32 3 times with data switch 64 operated during the (LD) th rotation to transfer into position 65 the bit switched from the timing loop during the previous step as shown in FIG. 3. This leaves the first data bit numbered "0" in position 79 just ready to enter the detector 72.

The inplane field is then rotated until all data bits numbered "0" have been propagated into the sensor element 78, and data switch 64 is operated either to duplicate each data bit (if a non-destructive readout is desired) or to replace each data bit (if a write operation is desired).

Figure 5:
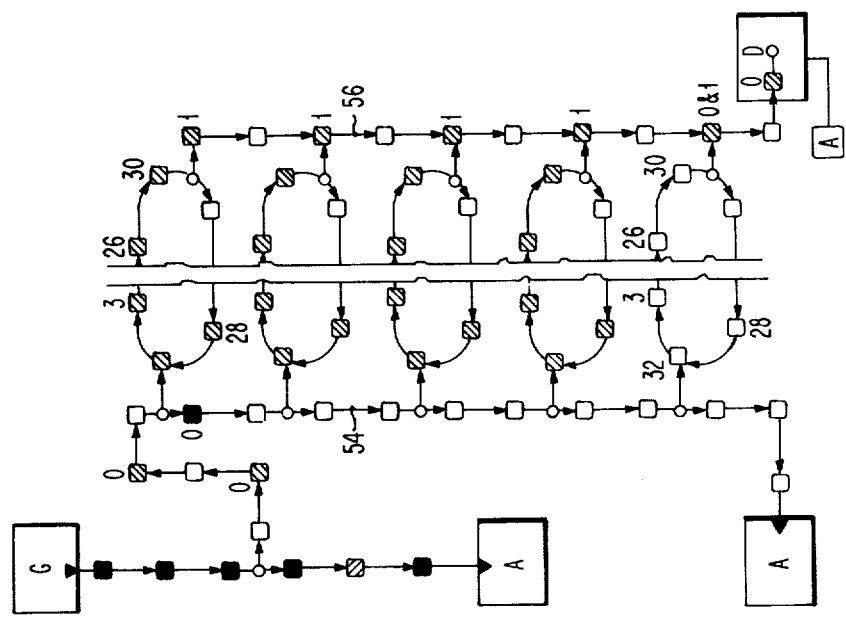
Figure 4:
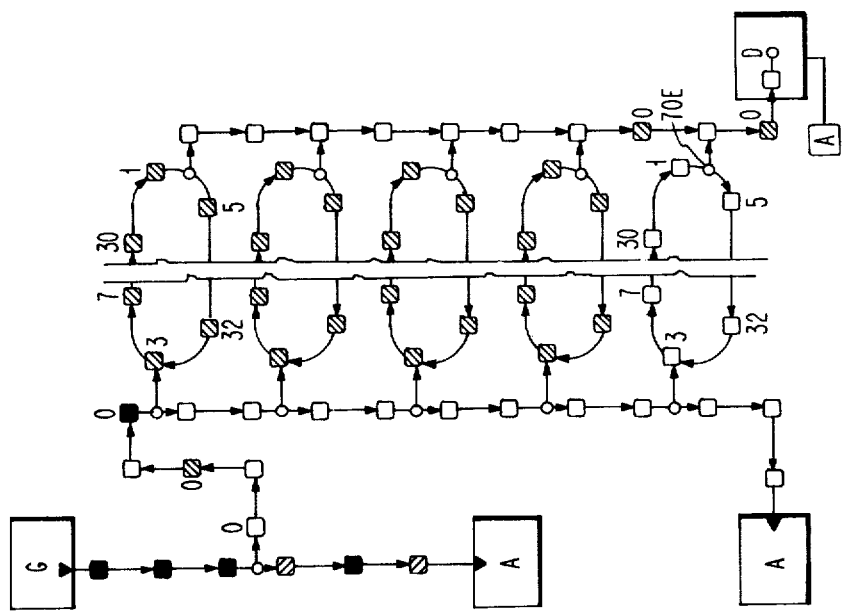

When a gap-free serial access is desired to the block whose number is 1 higher than the block being processed, for example, block "1" immediately after block "0" as in this case, the read transfer switches 70a, b, c, d and e are actuated to bring block 1 out of the loop exactly $2M=8$ rotations after block "0" was switched out of the loops. After 2M or 8 rotations in this case, the position of the bit from data loop 66a of block "0" is positioned directly next to the read switch 70e for timing loop 66e as shown in FIG. 4. When the $M=4$ data bits of block "1" are transferred from the data loops 66a-66d, they immediately follow the data bits of block "0" at alternate positions of channel 56 as shown in FIG. 5. It is to be noted that bit "1" from the timing loop has been switched on top of the last data bit from block "0." However, this causes no problems since bit "1" from the timing loop is guaranteed always to be a 0, that is, a space. It is also to be noted that the data from block "0" has been started in the write channel 54 so that the bubble from the timing loop and two other data bits from the "0" block are in channel 54.

Figure 6:
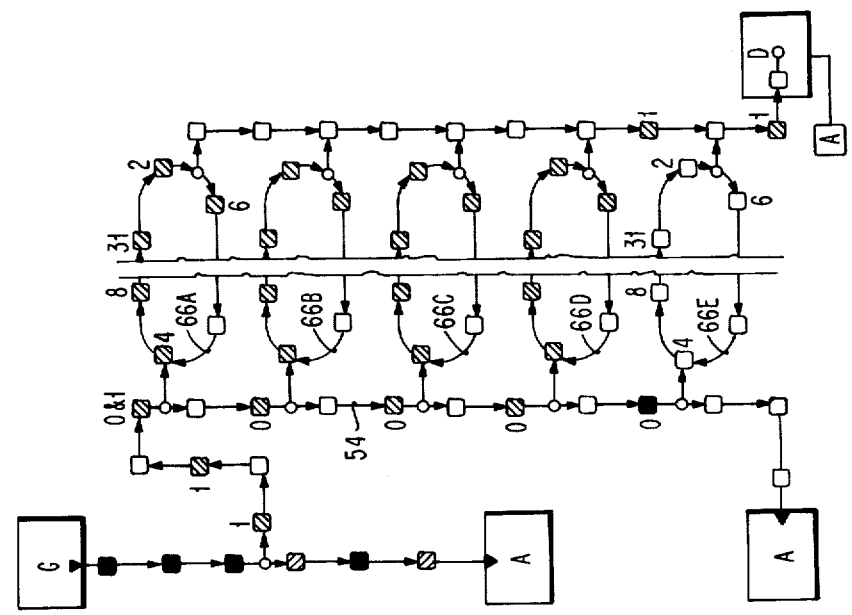

FIG. 6 illustrates the block "0" data and the timing loop "0" bubble in write channel 54 ready to be transferred back into the data storage loops 66a, b, c and d and into the timing loop 66e. The first part of the block "1" data follows the block "0" data in channel 54.

Figure 7:
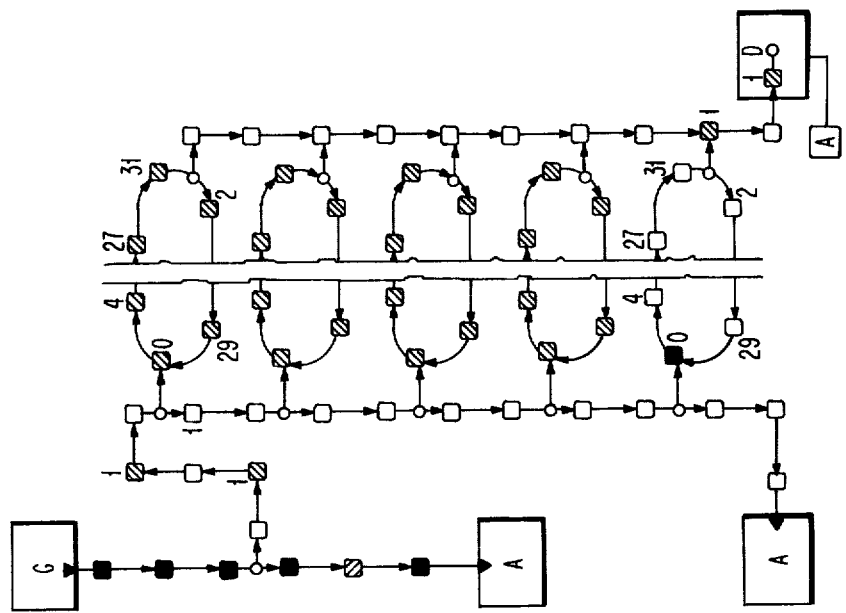

In FIG. 7, the "0" block data has been transferred back into the storage loops and the timing loops as shown.

Starting the read/write cycle requires a mechanism (not shown) external to the bubble chip for determining, after each inplane field rotation, the identity of the block of data just ready to enter switches 70a, b, c, d and e. For the sample major/minor loop configuration in FIGS. 1–7 can be done by an address counter, for example an modulo-N downcounter, which is properly initialized once and decremented four times (N=33) for each inplane field rotation.

The following procedure may be used to search for the sole bubble in the timing loop, and upon finding this bubble to initialize the address counter. For the first step, the inplane field is rotated $2M+1=9$ times for the device shown in FIG. 1 to clear the portion of the read channel 56 adjacent to the switches 70a, b, c, d and e. During these operations, data switch 64 is operated to recreate in the write channel each bit sensed by detector 72, and switches 68a, b, c, d and e are operated when appropriate to restore data to the minor loops. Copending patent application Ser. No. 826,492 filed 8/22/77 and assigned to the assignee of the present invention describes the use of a bubble domain shift-register to control the operation of switches 68a, b, c, d and e. For the second step, the inplane field is rotated once with switches 70a, b, c, d and e operated to bring a block of data out of the data loops and one bit from the timing loop and into the read channel 56, and with switches 64, 68a, b, c, d and e operated as in step 1. For the third step, the inplane field is then rotated $LD=3$ times with switches 64, 68a, b, c, d and e operated as in step 1. At this point, the bit switched from the timing loop at the previous step has been sensed by the detector 72 and recreated at position 65 by data switch 64. If the timing bit just sensed is a 1, then the sole bubble in the timing loop has been located. This means that the block most recently switched from the minor loops at the second step is block 0, and hence, that the state of the bubble chip is as shown in FIG. 3. In this case, the address counter can be initialized to $N-4(LD+1)=33-4(3+1)=17$, which is the address of the data block just ready to enter switches 70a, b, c, d and e, and the initialization process is completed.

On the other hand, if the timing bit just sensed at step 3 is a 0, then the search for the timing bubble must continue. In this case, rotate the inplane field $2M-LD+1=6$ times operating switches 64, 68a, b, c, d and e as in step 1, and then return to step 2.

While I have illustrated and described the preferred embodiment of my invention, it is understood that I do not limit myself to the precise constructions herein and the right is reserved to allow changes and modifications coming within the scope of the invention as defined in the appended claims.

I claim:

1. A bubble domain memory system having a major/minor loop array suitable for the storage and guided movement of bubble domains, the system comprising;
    a plurality of minor loops in said array adapted for the storage of data encoded as the presence or absence of bubble domains,
    a major loop positioned adjacent to the minor loops, said major loop including sensing means for detecting the presence or absence of bubbles, and
    a minor loop having a single bubble therein adapted for timing purposes and positioned adjacent to said major loop and closer to said sensing means than said data storage minor loops, and said timing minor loop adapted for retaining the rotational position of bubble domains in said data storage minor loops to provide gap-free serial access to the stored data.

2. A bubble domain system as described in claim 1 having M data loops, and said data loops having N bits of data, where N is an odd number.

3. A bubble domain system as described in claim 2 wherein 2M and N are relatively prime.

4. A bubble domain system as described in claim 2 wherein 2M+2 and N are relatively prime.

5. A bubble domain memory system having a major/minor loop array suitable for the storage and guided movement of bubble domains, the system comprising
    a major loop having a write portion channel and a read portion channel,
    a first data switch for transferring data into said write portion channel,
    a plurality of minor loops in said array adapted for the storage of data as the presence or absence or bubble domains, said minor loops having a first end associated with said write channel and a second end associated with said read channel, said plurality of minor loops including a first data loop positioned at the top of said array,
    a second data switch for transferring data from said write portion channel into said first data loop,
    a minor loop having a single bubble therein adapted for timing purposes and positioned below said data storage minor loops and at the bottom of said array,
    a third switch in said timing minor loop for transferring the timing bubble into said read portion channel, and
    a sensing element connected to said read portion channel for detecting the presence or absence of bubbles.

6. A bubble domain system as described in claim 5 wherein $$LD + SL + 2M = (N-1)/2$$

where
    LD is the number of bit positions in said read portion channel between said third switch and said sensing element,
    SE is the number of bit positions in said write portion channel between said first data switch and said second data switch,
    M is the number of data storage minor loops, and
    N is the number of bit positions in the data storage minor loops.

* * * * *